(12) United States Patent
Chen

(10) Patent No.: US 6,606,365 B1
(45) Date of Patent: Aug. 12, 2003

(54) MODIFIED FIRST-ORDER DIGITAL PLL WITH FREQUENCY LOCKING CAPABILITY

(75) Inventor: Dao-Long Chen, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/517,398

(22) Filed: Mar. 2, 2000

(51) Int. Cl.[7] .............................. H03D 3/24; H03L 7/00
(52) U.S. Cl. ........................................ 375/376; 331/25
(58) Field of Search ................................ 375/327, 359, 375/365, 368, 373, 374, 375, 376; 331/1 A, 1 R, 2, 11, 18, 25; 327/147, 148, 156, 157

(56) References Cited

U.S. PATENT DOCUMENTS

| | | | | |
|---|---|---|---|---|
| 5,075,639 A | * | 12/1991 | Taya | 331/2 |
| 5,406,592 A | * | 4/1995 | Baumert | 375/376 |
| 5,483,180 A | * | 1/1996 | Chai et al. | 326/93 |
| 5,734,301 A | * | 3/1998 | Lee et al. | 331/2 |
| 6,215,835 B1 | * | 4/2001 | Kyles | 375/376 |

* cited by examiner

*Primary Examiner*—Betsy L. Deppe
(74) *Attorney, Agent, or Firm*—Trexler, Bushnell, Giangiorgio & Blackstone, Ltd.

(57) ABSTRACT

A first-order digital PLL configured to accommodate a large frequency difference between a clock signal embedded in an incoming data stream received by a phase-locked loop and a local reference clock signal received by a phase-locked loop circuit. The PLL includes a data sampler which receives the incoming data stream, a frequency-locked loop (FLL) which receives the incoming data stream and is connected to the data sampler, and a frequency synthesizer which receives the local reference clock signal and is connected to the FLL. The FLL is provides a signal having a frequency which is substantially equal to the frequency of the local reference clock signal when no incoming data stream is received by the FLL, and provides a signal having a frequency which is substantially equal to the frequency of the incoming data stream when the FLL receives the incoming data stream.

11 Claims, 2 Drawing Sheets

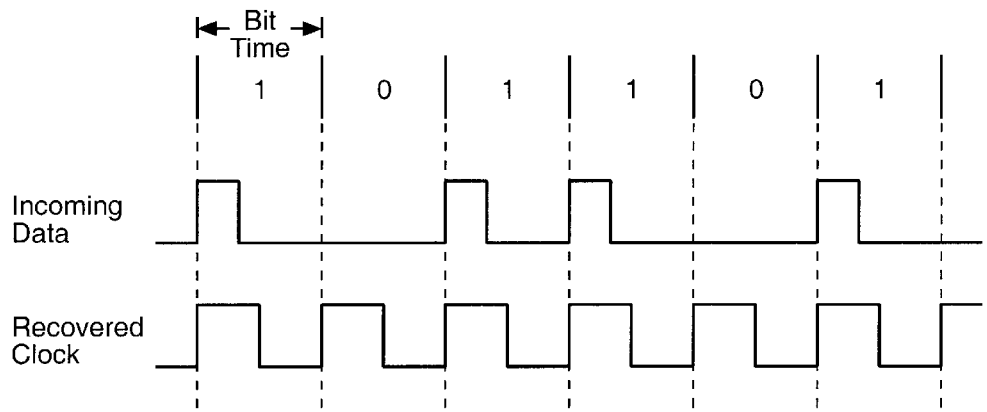
FIG._1
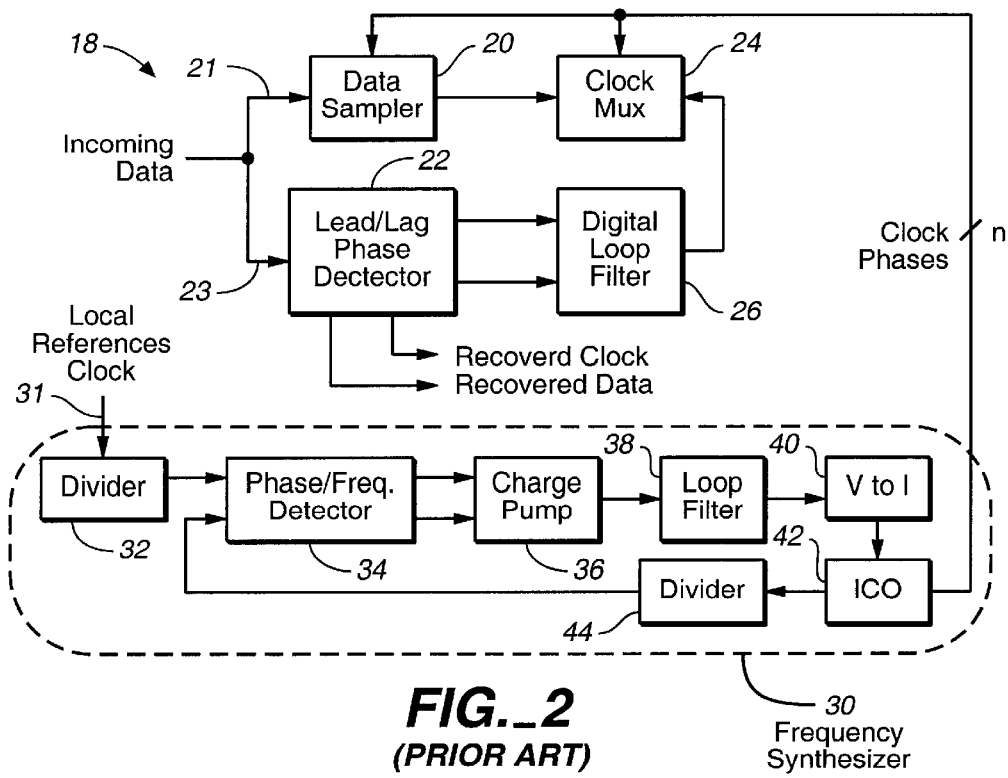
FIG._2
(PRIOR ART)

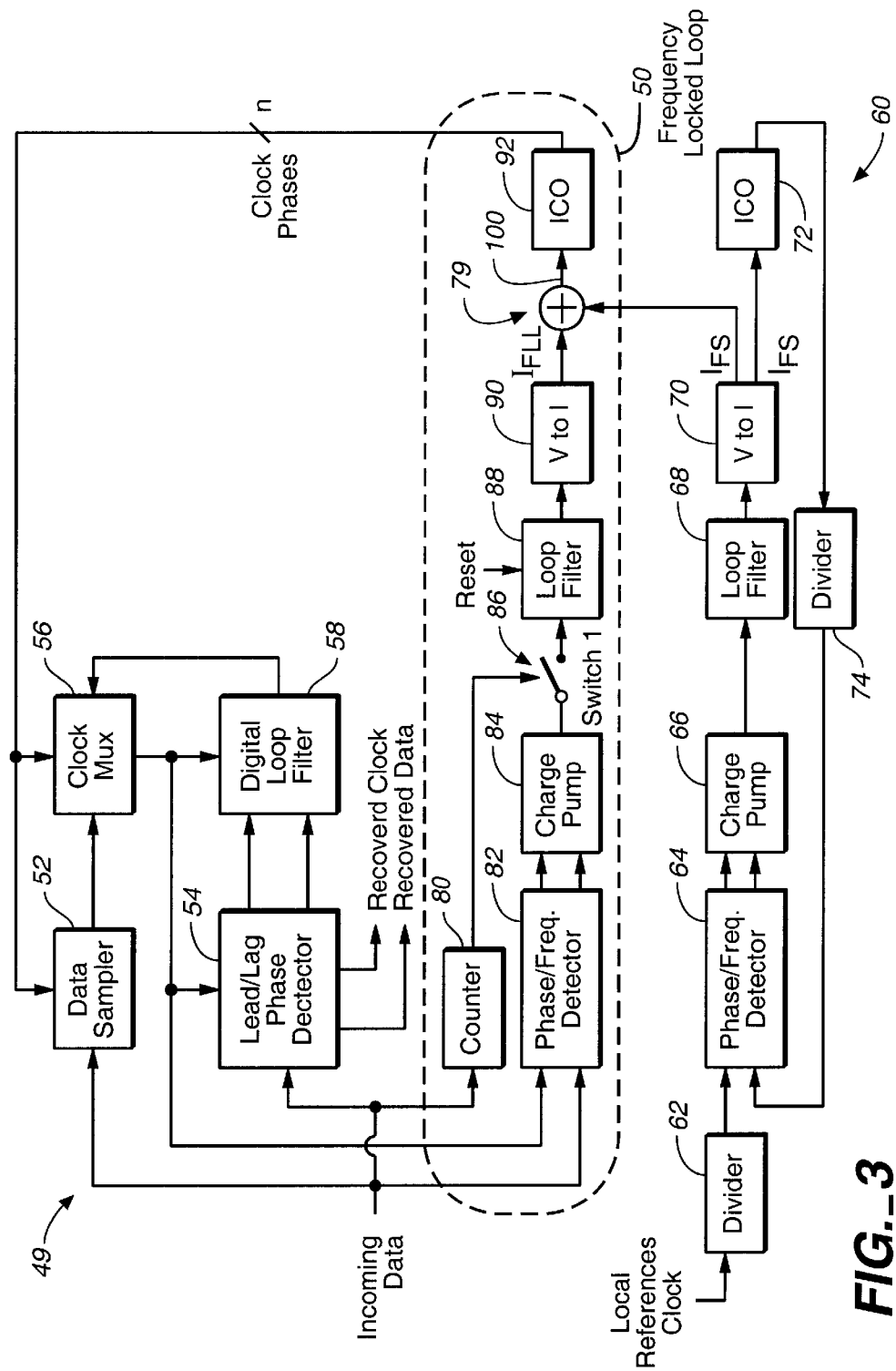
FIG._3

MODIFIED FIRST-ORDER DIGITAL PLL WITH FREQUENCY LOCKING CAPABILITY

The present invention relates generally to phase-locked loops, and more specifically relates to a modified first-order digital phase-locked loop which is configured to accommodate large frequency differences.

BACKGROUND OF THE INVENTION

Typically, when data is read from a disk drive, a read channel chip inside the disk drive extracts an embedded clock signal from a data stream. The embedded clock signal which is extracted from the data stream is often referred to as the "recovered clock." FIG. 1 illustrates typical waveforms of incoming data and a "recovered clock" in a disk drive read application.

Usually, an analog phase-locked loop (PLL) is used to extract the clock signal from the incoming data. Unfortunately, analog PLL's present several disadvantages. For example, the performance of an analog PLL is typically quite sensitive to process, temperature and supply voltage variations. Additionally, the structure and characteristics of analog PLL's typically often render it relatively difficult to effectively migrate to a new process technology. Still further, analog PLL's are typically sensitive to noise.

Because analog PLL's present certain disadvantages, some of which have been discussed above, it is sometimes advantageous to utilize a digital PLL instead of utilizing an analog PLL in disk drives. In fact, utilizing a simple first-order digital PLL to recover a clock signal from incoming data in a disk drive has proven to be very effective, so long as the difference in frequency between the local clock and the recovered clock is relatively small, such as approximately +/−100 p.p.m. (See, for example, Dao-Long Chen, "A power and area efficient CMOS clock/data recovery circuit for high-speed serial interfaces", IEEE Journal of Solid-State Circuits, vol. 31, no. 8, August 1996).

A typical first-order digital PLL which is used in connection with a disk drive is illustrated in FIG. 2. As shown, the PLL 18 includes a data sampler 20 and a lead/lag phase detector 22 which receive incoming data (along leads. 21 and 23). The PLL 18 also includes a clock multiplexer 24 (identified in FIG. 2 as "Clock Mux"), a digital loop filter 26 and a frequency synthesizer 30. The frequency synthesizer 30 receives a local reference clock (along lead 31) and includes a divider 32, a phase/frequency detector 34, a charge pump 36, a loop filter 38, a voltage-to-current converter 40 (identified in FIG. 2 as "V to I"), a current-controlled oscillator 42 (identified in FIG. 2 as "ICO") and another divider 44.

In operation, the frequency synthesizer 30 uses the local reference clock to generate n clock phases, where the clock phases are generally equally spaced apart in time. The data sampler 20 receives the clock phases from the frequency synthesizer 30, and uses the clock phases to sample the incoming data. Based on the sampled results, one of the clock phases is selected as the recovered clock. For example, if the incoming data transitions from 0 to 1 between clock phase m and m+1, clock phase m is selected as the recovered clock.

Once a clock phase is selected, the data sampler 20 is disabled to conserve power. In the meantime, the PLL 18 switches to a data tracking mode, wherein the lead/lag phase detector 22 detects if the selected clock phase is leading or lagging the data whenever a data transition occurs. If the selected clock phase consistently lags the data (e.g. 6 out of 8 transitions), the PLL 18 will effectively replace phase m with phase m−1 as the recovered clock. The loop filter 38 effectively controls how frequently the PLL 18 will act to update the recovered clock.

The PLL 18 illustrated in FIG. 2 will fail if there is a large frequency difference between the recovered clock and the local clock. For example, if there is a frequency 5% difference, and the PLL 18 has ten clock phases (i.e., n=10), each bit time will result in a phase shift equivalent to 0.5 of a clock phase. In other words, the PLL 18 will have to update the recovered clock every two bit times just to compensate for the frequency difference. As a result, the loop bandwidth will be too wide to reject any transient noise. In order to track the large frequency difference without introducing an excessive amount of jitter, a second-order digital PLL must be used. (See, for example, Lindsey et al., "A survey of digital phase-locked loops", Proceedings of the IEEE, vol. 69, no. 4, pp. 410–431, April 1981).

In removable disk drives, the frequency difference between the local clock and the recovered clock could be relatively large, such as +/−2.5%, because the data could be written by another drive. Therefore, typically a second-order digital PLL must be used in connection with removable disk drives. Unfortunately, it is difficult to design a second-order digital PLL that can meet all the requirements of a disk drive application. (See, for example, Beomsup Kim, "Dual-loop DPLL gear-shifting algorithm for fast synchronization", IEEE Transactions on Circuits and Systems-II: Analog and Digital Signal Processing, vol. 44, no. 7, pp. 577–586, July 1997). Furthermore, a second-order digital PLL is typically much more complex than a first-order digital PLL, and typically consumes more power and chip area.

Because a first-order digital PLL is less complex and consumes less power and area than does a second-order digital PLL, it would be advantageous to utilize a first-order digital PLL in a disk drive application in which the difference in frequency between the local clock and the recovered clock is expected to be relatively large.

OBJECT AND SUMMARY

It is an object of an embodiment of the present invention to provide a first-order digital PLL which is configured to accommodate large frequency differences between a local clock and a recovered clock.

It is a further object of an embodiment of the present invention to provide a first-order digital PLL which can be used in connection with removable disk drives.

Briefly, and in accordance with at least one of the foregoing objects, an embodiment of the present invention provides a first-order digital PLL which is configured to accommodate a large frequency difference between a clock signal embedded in an incoming data stream received by the phase-locked loop and a local reference clock signal received by the phase-locked loop circuit. The PLL includes a data sampler which receives the incoming data stream, a frequency-locked loop (FLL) which receives the incoming data stream and is connected to the data sampler, and a frequency synthesizer which receives the local reference clock signal and is connected to the FLL. The FLL is configured to provide a first signal to the data sampler when no incoming data stream is received by the FLL, and the first signal has a frequency which is generally equal to the frequency of the local reference clock signal. The FLL is configured to provide a second signal to the data sampler when the FLL receives the incoming data stream, and the second signal has a frequency which is generally equal to the frequency of the incoming data stream.

Preferably, both the FLL and the frequency synthesizer include a phase/frequency detector, a charge pump connected to the phase/frequency detector, a loop filter connected to the charge pump, a voltage-to-current converter connected to the loop filter, and a current-controlled oscillator connected to the voltage-to-current converter. Preferably, the FLL is configured to disconnect the loop filter from the charge pump when no incoming data stream is received by the FLL. Preferably, the FLL is configured to connect the loop filter to the charge pump when the FLL receives the incoming data stream. Preferably, the current-controlled oscillator of the FLL is configured to selectively operate at the frequencies of the local reference clock signal and the incoming data stream and is configured to provide the first and second signals to the data sampler. Preferably, the FLL includes a switch between the charge pump and the loop filter, and includes a counter which receives the incoming data stream and is configured to control the switch. The incoming data stream preferably includes a synchronization field which precedes a data field, and preferably the FLL is configured to provide the second signal to the data sampler while the synchronization field is being received by the PLL.

BRIEF DESCRIPTION OF THE DRAWINGS

The present invention and the advantages thereof will become more apparent upon consideration of the following detailed description when taken in conjunction with the accompanying drawings of which:

FIG. 1 is a diagram showing two waveforms in connection with a disk drive read operation—one corresponding to incoming data and another corresponding to a recovered clock;

FIG. 2 is a schematic diagram illustrating a prior art first-order digital PLL; and FIG. 3 Is a schematic diagram illustrating a modified first-order digital PLL in accordance with an embodiment of the present invention, wherein the PLL includes a frequency-locked loop (FLL).

DETAILED DESCRIPTION OF AN EMBODIMENT OF THE INVENTION

FIG. 3 illustrates a first-order digital PLL 49 which is in accordance with an embodiment of the present invention. The PLL 49 illustrated in FIG. 3 includes many of the same components as does the PLL 18 illustrated in FIG. 2, but also includes a frequency-locked loop (FLL) 50. As will be described more fully herein, the FLL 50 effectively tracks out the frequency difference between a clock signal embedded in the incoming data and local reference clock and provides that the PLL 49 can accommodate large frequency differences.

The PLL 49 shown in FIG. 3, like the PLL 18 shown in FIG. 2, includes a data sampler 52 and a lead/lag phase detector 54 (identified in FIG. 3 as "Lead/Lag PD"), both of which receive incoming data having a clock signal embedded therein. The PLL 49 also includes a clock multiplexer 56 (identified in FIG. 3 as "Clock MUX") and a digital loop filter 58 (identified in FIG. 3 as "Digital LF"). The PLL 49 also includes a frequency synthesizer 60 which, like the frequency synthesizer 30 illustrated in FIG. 2, includes a divider 62, a phase/frequency detector 64 (identified as "PFD"), a charge pump 66 (identified as "CP"), a loop filter 68 (identified as "LF"), a voltage-to-current converter 70 (identified as "V to I"), a current-controlled oscillator 72 (identified as "ICO") and another divider 74.

A current, $I_{FS}$, from the voltage-to-current converter 70 of the frequency synthesizer 60 is received by an adder 79 of the FLL 50 as well as by the current-controlled oscillator 72 of the frequency synthesizer 60. Specifically, the FLL 50 includes a counter 80 which receives the incoming data as well as a phase/frequency detector 82 (identified as "PFD") which receives the incoming data. The FLL 50 also includes a charge pump 84 (identified as "CP"), a switch 86 (identified as "switch 1") which is controlled by the counter 80, a loop filter 88 (identified as "LF") that is resettable via reset signal (identified as "Reset"), a voltage-to-current converter 90 (identified as "V to I") and a current-controlled oscillator 92 (identified as "ICO"). Preferably, the phase/frequency detector 82 of the FLL 50 is configured to manipulate NRZ data thereby rendering the PLL 49 compatible with NRZ data.

As shown, the adder 79 of the FLL 50 receives current $I_{FS}$ from the voltage-to-current converter 70 of the frequency synthesizer 60 as well as receives current $I_{FLL}$ from the voltage-to-current converter 90 of the FLL 50. The added current (along lead 100) is received by the current-controlled oscillator 92 of the FLL 50 which generates n clock phases which are received by the data sampler 52 and clock multiplexer 56.

The FLL 50 effectively tracks out the frequency difference between the clock signal embedded in the incoming data and the local reference clock. The frequency of the current-controlled oscillator 92 of the FLL 50 is controlled by $I_{FS}+I_{FLL}$. When the read channel chip is not reading data, the loop filter 88 in the FLL 50 is disconnected from the charge pump 84 by opening switch 86 and the output of the loop filter 88 is reset to a default value (using the reset signal identified "Reset") so that $I_{FLL}=0$. As a result, the current-controlled oscillator 92 in the FLL 50 is operating at the same frequency as the frequency synthesizer 60 (which is effectively locked to the local reference clock) since, at this time, the current-controller oscillator 92 of the FLL 50 is effectively exactly the same as the current-controller oscillator 72 of the frequency synthesizer 60 and both have a control current of $I_{FS}$.

The incoming data received by the PLL 49 preferably consists of a synchronization field (often referred to as a "sync field") that precedes data contained in a data field. The sync field consists of alternating 1's and 0's and is available for the PLL 49 to use to synchronize with the incoming data.

In operation, when the disk drive starts reading data, and the sync field is being received, the FLL 50 is enabled by the closing of switch 86. In the meantime, the data sampler 52 select one of the clock phases as the recovered clock. As a result of the data sampler 52 effectively removing the initial phase difference, the FLL 50 can lock onto the incoming data in a shorter period of time. This is specifically useful in applications wherein the sync field is short, wherein the PLL 49 is required to synchronize quickly with the incoming data.

Preferably, the FLL 50 has enough bandwidth such that, by the end of the PLL 49 receiving the sync field, the FLL 50 will have locked onto the incoming data. In other words, by the end of the PLL 49 receiving the sync field, the current-controlled oscillator 92 in the FLL 50 is preferably operating at the same frequency as the incoming data. At this point in time, switch 86 is opened again. Other than some small amount of "leakage", the output of the loop filter 88 of the FLL 50 will generally maintain a constant level, and the current-controlled oscillator 92 will oscillate at the correct frequency. By disconnecting the loop filter 88 of the FLL 50 from the charge pump 84, the possibility of harmonic locking by the FLL 50 while the PLL 49 receives the data field is removed. Without having to deal with random data, it makes designing the FLL 50 much easier. Since the leakage current is relatively small and each data sector is usually only 512 bytes long, the amount of frequency drift while the PLL 49 receives the data field is typically negligible.

Preferably, after the PLL 49 has received the sync field, the PLL 49 is enabled to filter out any transient noise. Since the frequency difference is removed by the FLL 50, it is possible to use a first-order digital PLL, and any small amount of frequency drift caused by leakage while the data field was being received by the PLL 49 will also be tracked out by the PLL 49.

The PLL 49 illustrated in FIG. 3 is capable of recovering clock and data signals from an incoming data stream which has a clock signal embedded therein that has a frequency which differs greatly from the local clock. Compared to a pure analog implementation, the PLL 49 illustrated in FIG. 3 is less sensitive to noise, is less sensitive to process, temperature and supply voltage variations, is easier to design since no bandwidth shifting is required (i.e., the loop bandwidths during the sync field and data field are determined separately by the FLL 50 and the digital PLL 49), provides that a zero phase start circuit is easily implemented by the data sampler 52, and decreases the possibility of harmonic locking. Compared to a second-order digital PLL, the PLL 49 illustrated in FIG. 3 is generally easier to design, consumes less power and chip area, and is generally capable of operating at higher speeds.

While a preferred embodiment of the present invention is shown and described, it is envisioned that those skilled in the art may devise various modifications of the present invention without departing from the spirit and scope of the appended claims.

What is claimed is:

1. A first-order digital phase-locked loop configured to accommodate a large frequency difference between a clock signal embedded in an incoming data stream received by the phase-locked loop and a local reference clock signal received by the phase-locked loop circuit, said phase-locked loop comprising: a data sampler which receives the incoming data stream: a frequency-locked loop which receives the incoming data stream and is connected to said data sampler; and a frequency synthesizer which receives the local reference clock signal and is connected to said frequency-locked loop, wherein said frequency-locked loop is configured to provide a first signal to said data sampler when no incoming data stream is received by said frequency-locked loop circuit, wherein the first signal has a frequency which is substantially equal to a frequency of the local reference clock signal, and wherein said frequency-locked loop is configured to provide a second signal to said data sampler when said frequency-locked loop receives the incoming data stream, wherein the second signal has a frequency which is substantially equal to a frequency of the incoming data stream, wherein said frequency-locked loop includes a charge pump and a loop filter, and said frequency-locked loop is configured to disconnect said loop filter from said charge pump when no incoming data stream is received by said frequency-locked loop circuit, and wherein said frequency-locked loop is configured to connect said loop filter to said charge pump when said frequency-locked loop receives the incoming data stream.

2. The first-order digital phase-locked loop as recited in claim 1, wherein said frequency-locked loop includes a current-controlled oscillator which is configured to selectively operate at the frequencies of the local reference clock signal or the incoming data stream and is configured to provide the first and second signals to said data sampler.

3. A first-order digital phase-locked loop configured to accommodate a large frequency difference between a clock signal embedded in an incoming data stream received by the phase locked loop and a local reference clock signal received by the phase-locked loop circuit, said phase-locked loop comprising: a data sampler which receives the incoming data steam; a frequency-locked loop which receives the incoming data stream and is connected to said data sampler; and a frequency synthesizer which receives the local reference clock signal and is connected to said frequency-locked loop, wherein said frequency-locked loop is configured to provide a first signal to said data sampler when no incoming data stream is received by said frequency-locked loop circuit, wherein the first signal has a frequency which is substantially equal to a frequency of the local reference clock signal, and wherein said frequency-locked loop is configured to provide a second signal to said data sampler when said frequency-locked loop receives the incoming data stream, wherein the second signal has a frequency which is substantially equal to a frequency of the incoming data stream, wherein both said frequency-locked loop and said frequency synthesizer include a phase/frequency detector, a charge pump coupled to said phase/frequency detector, a loop filter connected to said charge pump, a voltage-to-current converter coupled to said loop filter, and a current-controlled oscillator connected to said voltage-to-current converter, wherein said frequency-locked loop is configured to disconnect said loop filter of said frequency-locked loop from said charge pump of said frequency-locked loop when no incoming data stream is received by said frequency-locked loop circuit, and wherein said frequency-locked loop is configured to connect said loop filter of said frequency-locked loop to said charge pump of said frequency-locked loop when said frequency-locked loop receives the incoming data stream.

4. The first-order digital phase-locked loop as recited in claim 3, wherein said frequency-locked loop further includes a switch between said charge pump and said loop filter.

5. The first-order digital phase-locked loop as recited in claim 4, wherein said frequency-locked loop further includes a counter which receives the incoming data stream and is configured to control said switch.

6. A first-order digital phase-locked loop configured to accommodate a large frequency difference between a clock signal embedded in an incoming data stream received by the phase-locked loop and a local reference clock signal received by the phase-locked loop circuit, said phase-locked loop comprising: a data sampler which receives the incoming data stream a frequency-locked loop which receives the incoming data stream and is connected to said data sampler; and a frequency synthesizer which receives the local reference clock signal and is connected to said frequency-locked loop, wherein said frequency-locked loop is configured to provide a first signal to said data sampler when no incoming data stream is received by said frequency-locked loop circuit, wherein the first signal has a frequency which is substantially equal to a frequency of the local reference clock signal, and wherein said frequency-locked loop is configured to provide a second signal to said data sampler when said frequency-locked loop receives the incoming data stream, wherein the second signal has a frequency which is substantially equal to a frequency of the incoming data stream, wherein the incoming data stream includes a synchronization field and a data field, wherein the synchronization field precedes the data field, wherein said frequency-locked loop is configured to provide the second signal to said data sampler while said synchronization field is being received by the phase-locked loop circuit.

7. A first-order digital phase-locked loop configured to accommodate a large frequency difference between a clock signal embedded in an incoming data stream received by the phase-locked loop and a local reference clock signal received by the phase-locked loop circuit, said phase-locked loop comprising: a data sampler which receives the incoming data stream; a frequency-locked loop which receives the incoming data stream and is connected to said data sampler; and a frequency synthesizer which receives the local reference clock signal and is connected to said frequency-locked loop, wherein said frequency-locked loop is configured to provide a first signal to said data sampler when no incoming data stream is received by said frequency-locked loop circuit, wherein the first signal has a frequency which is substantially equal to a frequency of the local reference clock signal, wherein said frequency-locked loop is configured to provide a second signal to said data sampler when said frequency-locked loop receives the incoming data stream, wherein the second signal has a frequency which is substantially equal to a frequency of the incoming data stream, wherein each of said frequency-locked loop and said frequency synthesizer includes a phase/frequency detector, a charge pump connected to said phase/frequency detector, a loop filter coupled to said charge pump, a voltage-to-current converter connected to said loop filter, and a current-controlled oscillator coupled to said voltage-to-current converter, wherein said frequency-locked loop is configured to connect said loop filter of said frequency-locked loop to said charge pump of said frequency-locked loop when said frequency-locked loop receives the incoming data stream, wherein said current-controlled oscillator of said frequency-locked loop is configured to selectively operate at the frequencies of the local reference clock signal and the incoming data stream and is configured to provide the first and second signals to said data sampler, wherein said frequency-locked loop further includes a switch between said charge pump and said loop filter, and wherein said frequency-locked loop further includes a counter which receives the incoming data stream and is configured to control said switch, wherein the incoming data stream includes a synchronization field and a data field, wherein the synchronization field precedes the data field, wherein said frequency-locked loop is configured to provide the second signal to said data sampler while said synchronization field is being received by the phase-locked loop circuit.

8. A first-order digital phase-locked loop configured to accommodate a large frequency difference between a clock signal embedded in an incoming data stream received by the phase-locked loop and a local reference clock signal received by the phase-locked loop circuit said phase-locked loop comprising: a data sampler which receives the incoming data stream, a frequency-locked loop which receives the incoming data stream and is connected to said data sampler; and a frequency synthesizer which receives the local reference clock signal and is connected to said frequency-locked loop, wherein said frequency-locked loop includes a current-controlled oscillator which is configured to selectly operate at a frequency of the local reference clock signal or a frequency of the incoming data stream and is configured to provide a signal to said data sampler, wherein said current-controlled oscillator of said frequency-locked loop is configured to provide a first signal to said data sampler when no incoming data stream is received by said frequency-locked loop, wherein the first signal has a frequency which is substantially equal to the frequency of the local reference clock signal, and wherein said frequency-locked loop is configured to provide a second signal to said data sampler when said frequency-locked loop receives the incoming data stream, wherein the second signal has a frequency which is substantially equal to the frequency of the incoming data streams, wherein said frequency-locked loop includes a charge pump and a loop filter, and said frequency-locked loop is configured to disconnect said loop filter from said charge pump when no incoming data stream is received by said frequency-locked loop circuit, and wherein said frequency-locked loop is configured to connect said loop filter to said charge pump when said frequency-locked loop receives the incoming data stream.

9. The first-order digital phase-locked loop as recited in claim 8, wherein said frequency-locked loop further includes a switch between said charge pump and said loop filter.

10. The first-order digital phase-locked loop as recited in claim 9, wherein said frequency-locked loop further includes a counter which receives the incoming data stream and is configured to control said switch.

11. The first-order digital phase-locked loop as recited in claim 8, wherein the incoming data stream includes a synchronization field and a data field, wherein the synchronization field precedes the data field, wherein said frequency-locked loop is configured to provide the second signal to said data sampler while said synchronization field is being received by the phase-locked loop circuit.

* * * * *